US011152274B2

(12) United States Patent
Lee et al.

(10) Patent No.: US 11,152,274 B2
(45) Date of Patent: Oct. 19, 2021

(54) MULTI-MOLDINGS FAN-OUT PACKAGE AND PROCESS

(71) Applicant: Advanced Semiconductor Engineering, Inc., Kaohsiung (TW)

(72) Inventors: Wei-Hsuan Lee, Kaohsiung (TW); Sung-Mao Li, Kaohsiung (TW); Ming-Han Wang, Kaohsiung (TW); Ian Hu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 119 days.

(21) Appl. No.: 15/701,394

(22) Filed: Sep. 11, 2017

(65) Prior Publication Data

US 2019/0080975 A1 Mar. 14, 2019

(51) Int. Cl.
*H01L 23/31* (2006.01)
*H01L 21/56* (2006.01)
(Continued)

(52) U.S. Cl.
CPC ........ *H01L 23/3135* (2013.01); *H01L 21/568* (2013.01); *H01L 23/3107* (2013.01);
(Continued)

(58) Field of Classification Search
CPC ...... H01L 23/135; H01L 24/13; H01L 21/565
See application file for complete search history.

(56) References Cited

U.S. PATENT DOCUMENTS 5,737,191 A * 4/1998 Horiuchi ............... H01L 21/563
174/251
5,866,953 A * 2/1999 Akram .................. H01L 21/563
257/687
(Continued)

FOREIGN PATENT DOCUMENTS

CN 1451178 A 10/2003
CN 101083235 A 12/2007
(Continued)

OTHER PUBLICATIONS

Office Action from corresponding Chinese Patent Application No. 201810321753.0, issued on Aug. 10, 2021, 15 pages.
(Continued)

*Primary Examiner* — Peniel M Gumedzoe
(74) *Attorney, Agent, or Firm* — Foley & Lardner LLP

(57) ABSTRACT

A semiconductor device package includes a semiconductor device, a conductive bump, a first encapsulant and a second encapsulant. The semiconductor device has a first surface, a second surface and a lateral surface. The second surface is opposite to the first surface. The lateral surface extends between the first surface and the second surface. The semiconductor device comprises a conductive pad adjacent to the first surface of the semiconductor device. The conductive bump is electrically connected to the conductive pad. The first encapsulant covers the first surface of the semiconductor device and a first portion of the lateral surface of the semiconductor device, and surrounds the conductive bump. The second encapsulant covers the second surface of the semiconductor device and a second portion of the lateral surface of the semiconductor device.

11 Claims, 12 Drawing Sheets

(51) Int. Cl.
*H01L 23/00* (2006.01)
*H01L 23/544* (2006.01)

(52) U.S. Cl.
CPC .......... *H01L 23/3142* (2013.01); *H01L 24/13* (2013.01); *H01L 24/96* (2013.01); *H01L 21/565* (2013.01); *H01L 23/544* (2013.01); *H01L 2223/54426* (2013.01); *H01L 2223/54486* (2013.01); *H01L 2224/214* (2013.01); *H01L 2924/182* (2013.01); *H01L 2924/1815* (2013.01); *H01L 2924/18162* (2013.01); *H01L 2924/3511* (2013.01)

(56) References Cited

U.S. PATENT DOCUMENTS

| | | | |
|---|---|---|---|
| 6,365,441 B1 * | 4/2002 | Raiser | H01L 21/563 257/E21.503 |
| 7,294,533 B2 * | 11/2007 | Lebonheur | H01L 21/563 257/787 |
| 7,375,435 B2 * | 5/2008 | Wang | H01L 21/563 |
| 7,476,975 B2 * | 1/2009 | Ogata | H01L 21/563 257/778 |
| 7,906,860 B2 | 3/2011 | Meyer et al. | |
| 8,431,441 B2 | 4/2013 | Chino | |
| 9,123,733 B1 * | 9/2015 | Huang | H01L 21/561 |
| 9,337,086 B2 | 5/2016 | Scanlan | |
| 9,508,621 B2 | 11/2016 | Lin et al. | |
| 9,589,932 B2 | 3/2017 | Yu et al. | |
| 2002/0089836 A1 | 7/2002 | Ishida et al. | |
| 2006/0046321 A1 | 3/2006 | Peters | |
| 2007/0278667 A1 | 12/2007 | Kusano et al. | |
| 2008/0237892 A1 * | 10/2008 | Saeki | H01L 21/563 257/778 |
| 2009/0072391 A1 | 3/2009 | Kolan et al. | |
| 2011/0121449 A1 * | 5/2011 | Lin | H01L 21/568 257/737 |
| 2013/0037935 A1 * | 2/2013 | Xue | H01L 21/76898 257/737 |
| 2013/0168849 A1 | 7/2013 | Scanlan | |
| 2013/0299961 A1 | 11/2013 | Chen | |
| 2014/0273354 A1 | 9/2014 | Ramaswami et al. | |
| 2015/0179614 A1 * | 6/2015 | Murai | H01L 25/0657 257/784 |
| 2015/0187722 A1 | 7/2015 | Chiang et al. | |
| 2015/0255416 A1 | 9/2015 | Kim et al. | |
| 2015/0318228 A1 | 11/2015 | Ito | |
| 2017/0033026 A1 | 2/2017 | Ho et al. | |
| 2017/0033063 A1 | 2/2017 | Lin et al. | |
| 2017/0092624 A1 | 3/2017 | Chen et al. | |
| 2017/0117200 A1 * | 4/2017 | Kim | H01L 21/561 |
| 2017/0221844 A1 | 8/2017 | Lee et al. | |
| 2018/0130760 A1 * | 5/2018 | Wang | H01L 23/367 |

FOREIGN PATENT DOCUMENTS

| | | |
|---|---|---|
| CN | 102082102 A | 6/2011 |
| CN | 102097335 A | 6/2011 |
| CN | 102122646 A | 7/2011 |
| CN | 102931094 A | 2/2013 |
| CN | 103187322 A | 7/2013 |
| CN | 103390600 A | 11/2013 |
| CN | 104766837 A | 7/2015 |
| CN | 104919586 A | 9/2015 |
| CN | 105762084 A | 7/2016 |
| CN | 106068558 A | 11/2016 |
| CN | 106409699 A | 2/2017 |
| CN | 108074877 A | 5/2018 |
| EP | 1 111 674 A2 | 6/2001 |
| JP | 2000-260790 A | 9/2000 |
| JP | 2001-118968 A | 4/2001 |
| TW | 200601577 A | 1/2006 |

OTHER PUBLICATIONS

Search Report from corresponding Chinese Patent Application No. 201810321753.0, with English translation, issued on Aug. 10, 2021, 11 pages.

* cited by examiner

US 11,152,274 B2

MULTI-MOLDINGS FAN-OUT PACKAGE AND PROCESS

BACKGROUND

1. Technical Field

The present disclosure relates generally to an improved fan-out ball grid array (BGA) package structure, and to an improved package structure.

2. Description of the Related Art

A semiconductor device may be attached to a carrier (e.g. a substrate, a lead frame, etc.) and molded by an encapsulant to form a semiconductor device package. However, a warpage phenomenon, a die-shifting phenomenon or other problems may cause reliability issues. A backside protection (BSP) can be disposed on a backside of the semiconductor device for protection, which may increase a manufacturing cost.

SUMMARY

The present disclosure provides for one or more embodiments of an improved package structure having a small thickness, having a strip-type fan-out BGA structure, and having a small manufacturing cost. The present disclosure also provides for a multi-molding operation that can be used to control warpage of a semiconductor package and to help avoid die-shift. Since the semiconductor device is pressed during the first molding operation, the die-shifting phenomenon during molding operation can be reduced.

In some embodiments, a semiconductor device package includes a semiconductor device, a conductive bump, a first encapsulant and a second encapsulant. The semiconductor device has a first surface, a second surface and a lateral surface. The second surface is opposite to the first surface. The lateral surface extends between the first surface and the second surface. The semiconductor device further includes a conductive pad adjacent to the first surface of the semiconductor device. The conductive bump electrically connects to the conductive pad. The first encapsulant covers the first surface of the semiconductor device and a first portion of the lateral surface of the semiconductor device and surrounding the conductive bump. The second encapsulant covers the second surface of the semiconductor device and a second portion of the lateral surface of the semiconductor device.

In some embodiments, a semiconductor device package includes a semiconductor device, a conductive bump, a first encapsulant and a second encapsulant. The semiconductor device has a first surface, a second surface and a lateral surface. The second surface is opposite to the first surface. The lateral surface extends between the first surface and the second surface. The semiconductor device further includes a conductive pad adjacent to the first surface of the semiconductor device. The conductive bump electrically connects to the conductive pad. The first encapsulant covers a first portion of the lateral surface of the semiconductor device and surrounding the conductive bump. The second encapsulant covers a second portion of the lateral surface of the semiconductor device. A first surface of the first encapsulant is substantially coplanar with a first surface of the conductive bump.

In some embodiments, a method of manufacturing a semiconductor device package includes the following operations: providing a semiconductor device on a carrier, the semiconductor device having a first surface, a second surface opposite to the first surface and a lateral surface extending between the first surface and the second surface, and the semiconductor device including a conductive bump adjacent to the first surface; applying a first release film to a first portion of a mold chase; contacting the first release film with the second surface of the semiconductor device; and forming a first encapsulant covering the first surface of the semiconductor device and a first portion of the lateral surface of the semiconductor device.

Figure 1A:
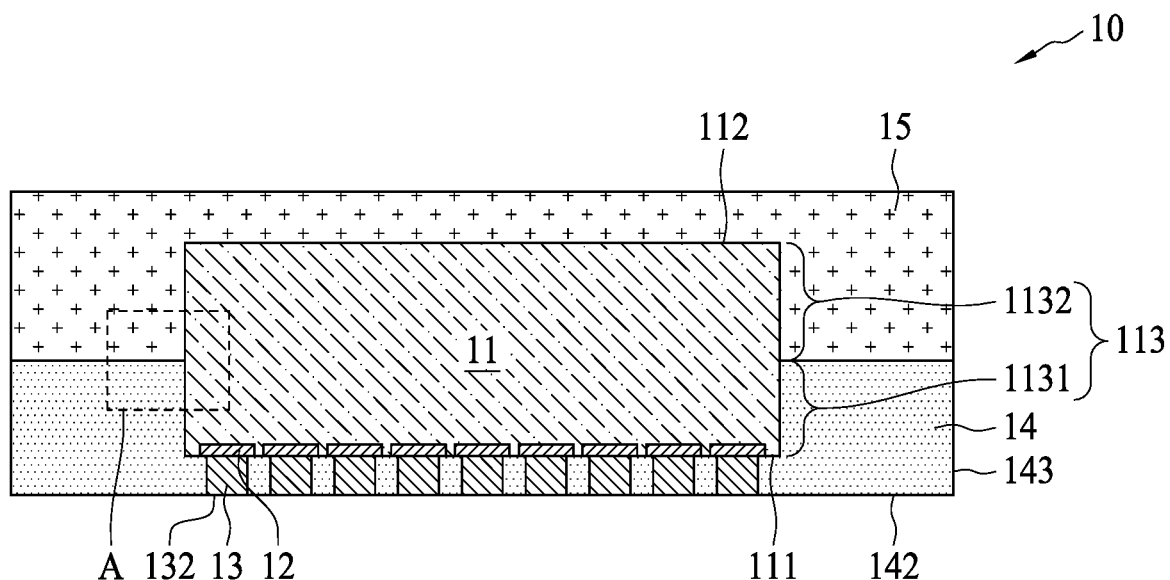
FIG. 1A illustrates a cross-sectional view of a semiconductor device package in accordance with some embodiments of the present disclosure.

Common reference numerals are used throughout the drawings and the detailed description to indicate the same or similar components. The present disclosure will be readily understood from the following detailed description taken in conjunction with the accompanying drawings.

DETAILED DESCRIPTION

As used herein, relative terms, such as "inner," "interior," "outer," "exterior," "top," "bottom," "front," "back," "upper," "upwardly," "lower," "downwardly," "vertical," "vertically," "lateral," "laterally," "above," and "below," refer to an orientation of a set of components with respect to one another; this orientation is in accordance with the drawings, and does not necessarily correspond to an orientation during manufacturing or use.

Fan-out wafer level packaging (FOWLP) can achieve a low-cost low-profile package solution for mobile application, and wafer level compression molding can be one fabrication process used to construct a reconfigured wafer that precedes a thin-film redistribution layer (RDL) process. A molding compound can be used for fan out interconnection fabrication, as well as a protection barrier to protect against corrosive or humid environments. However, die-shifting can be an issue in a compression molding process for FOWLP. An accurate location and/or positioning of the die can be specified for a high yield of the RDL process. If a die shifts away from its predetermined position (which is also known as "fly die"), significant misalignments may occur due to the die offset in subsequent steps. An RDL spacing specification and a contact pad pitch may be affected so that the package size and the yield lost may be increased.

As used herein, the term "warpage" refers to deformation of the structure of a semiconductor device package which reduces a planarity of one or more surfaces of the package. Magnitude of the warpage may be determined by the distance between the lowest point of a deformation of the package to the highest point of the deformation. Each package may have a different degree of warpage resulting from a change from room temperature (e.g., about 25 degrees Celsius (° C.)) to reflow temperature (e.g., about 260° C.), or from reflow temperature to room temperature. Further, warpage may occur while the semiconductor device package does not stay at a steady temperature, due to a mismatch in the coefficient of thermal expansion (CTE) between different components of the package. In other words, two sides of the package may be subject to different degrees of thermal expansion, resulting in stress effects that cause warpage. Additionally, as the overall thickness of the semiconductor structure decreases, warpage in a semiconductor structure may be more pronounced. Therefore, a solution for preventing warpage would be beneficial to the semiconductor industry.

FIG. 1A illustrates a cross-sectional view of a semiconductor device package 10 in accordance with some embodiments of the present disclosure. The semiconductor device package 10 includes a semiconductor device 11, a conductive bump 13, a first encapsulant 14 and a second encapsulant 15. The semiconductor device 11 has a first surface 111, a second surface 112 and a lateral surface 113. The second surface 112 is opposite to the first surface 111. The lateral surface 113 extends between the first surface 111 and the second surface 112. The semiconductor device 11 further includes a conductive pad 12 adjacent to the first surface 111 of the semiconductor device 11. The conductive bump 13 electrically connects to the conductive pad 12. In some embodiments, the conductive bump 13 can provide for off-chip connection, and can include, for example, a copper pillar or a pillar including another metal or alloy. The first encapsulant 14 covers the first surface 111 of the semiconductor device 11 and a portion 1131 of the lateral surface 113 of the semiconductor device 11, and surrounds the conductive bump 13. The second encapsulant 15 covers the surface 112 of the semiconductor device 11 and a portion 1132 of the lateral surface 113 of the semiconductor device 11. In some embodiments, the conductive bump 13 is exposed from the first encapsulant 14. In some embodiments, a surface 142 of the first encapsulant 14 is substantially coplanar with a surface 132 of the conductive bump 13.

In some embodiments, the conductive bump 13 is exposed from the first encapsulant 14 at a surface of the first encapsulant 14 (e.g. the surface 142), and a roughness of the surface 142 of the first encapsulant 14 is less than a roughness of a lateral surface 143 of the first encapsulant 14. In some embodiments, the conductive bump 13 is exposed from the first encapsulant 14 at a surface of the first encapsulant 14 (e.g. the surface 142), and a contact angle of the surface 142 (e.g. a contact angle with respect to water) of the first encapsulant 14 is greater than a contact angle of a lateral surface 143 of the first encapsulant 14.

Figure 1B:
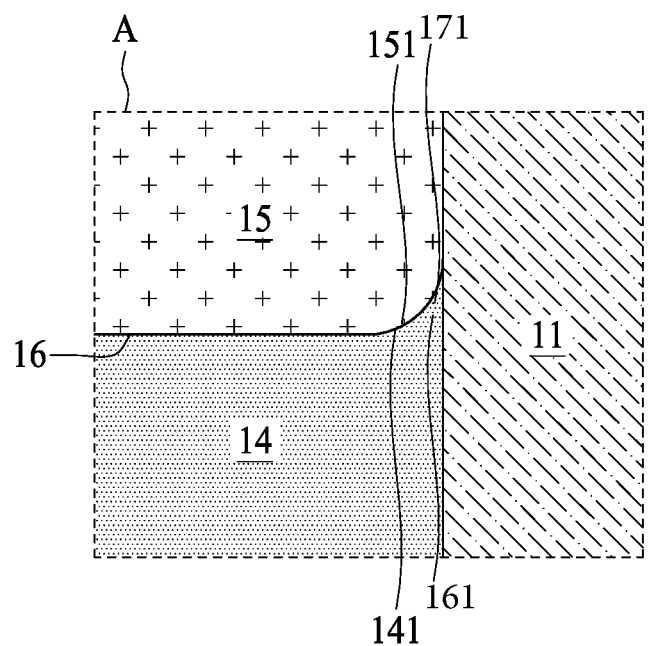
FIG. 1B illustrates a cross-sectional view of a portion of the semiconductor device package shown in FIG. 1A.

FIG. 1B illustrates a cross-sectional view of a portion A of the semiconductor device package 10 shown in FIG. 1A. In some embodiments, the semiconductor device package 10 includes a boundary 16 between the first encapsulant 14 and the second encapsulant 15, wherein the boundary 16 has a curved portion. In some embodiments, the first encapsulant 14 has a concave surface 141 that defines at least a portion of the boundary 16 between the first encapsulant 14 and the second encapsulant 15. In some embodiments, the second encapsulant 15 has a convex surface 151 that defines at least a portion of the boundary 16 between the first encapsulant 14 and the second encapsulant 15 (e.g. a curved corner surface 151). By implementing the structure shown in FIG. 1B, the contact area between the first encapsulant 14 and the second encapsulant 15 is increased relative to embodiments that implement a flat boundary so that the reliability is also increased and the possibility of peeling between the first encapsulant 14 and the second encapsulant 15 is decreased.

In some embodiments, the concave surface 141 of the first encapsulant 14 defines a protrusion 161, and the convex surface of the second encapsulant 15 defines a recess 171 that receives the protrusion 161.

In some embodiments, the first encapsulant 14 and the second encapsulant 15 have approximately or substantially equal CTEs. In some embodiments, the first encapsulant 14 and the second encapsulant 15 have different CTEs.

Figure 2:
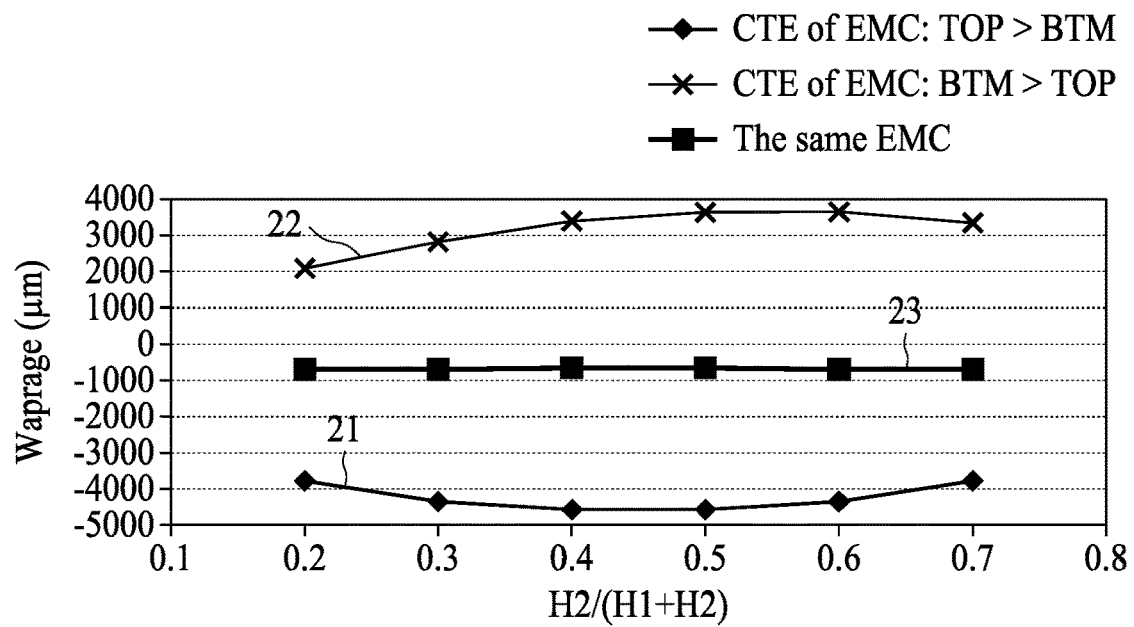
FIG. 2 illustrates an example of a warpage performance plot of a semiconductor device package in accordance with some embodiments of the present disclosure.

FIG. 2 illustrates an example of a warpage performance plot of a semiconductor device package in accordance with some embodiments of the present disclosure. In the example shown in FIG. 2, the warpage performance is measured in micrometers ($\mu m$) and is plotted on the vertical axis, labeled "Warpage ($\mu m$)". The ratio of a thickness H2 of the second encapsulant 14 to the sum of a thickness H1 of the first encapsulant 14 and the thickness H2 of the second encapsulant 15 is plotted on the horizontal coordinate, labeled "H2/(H1+H2)". There are three curves shown in FIG. 2. The curve 21 is marked with diamonds and represents the warpage performance of semiconductor device packages in which a CTE of an epoxy molding compound (EMC) of the second encapsulant 15 ("TOP") is larger than a CTE of an EMC of the first encapsulant 14 ("BTM"). The curve 22 is marked with crosses and represents the warpage performance of semiconductor device packages in which the CTE of the EMC of the second encapsulant 15 is smaller than the CTE of the EMC of the first encapsulant 14. The curve 23 is marked with squares and represents the warpage performance of semiconductor device packages in which the CTE of the EMC of the second encapsulant 15 is equal to the CTE of the EMC of the first encapsulant 14.

Figure 3:
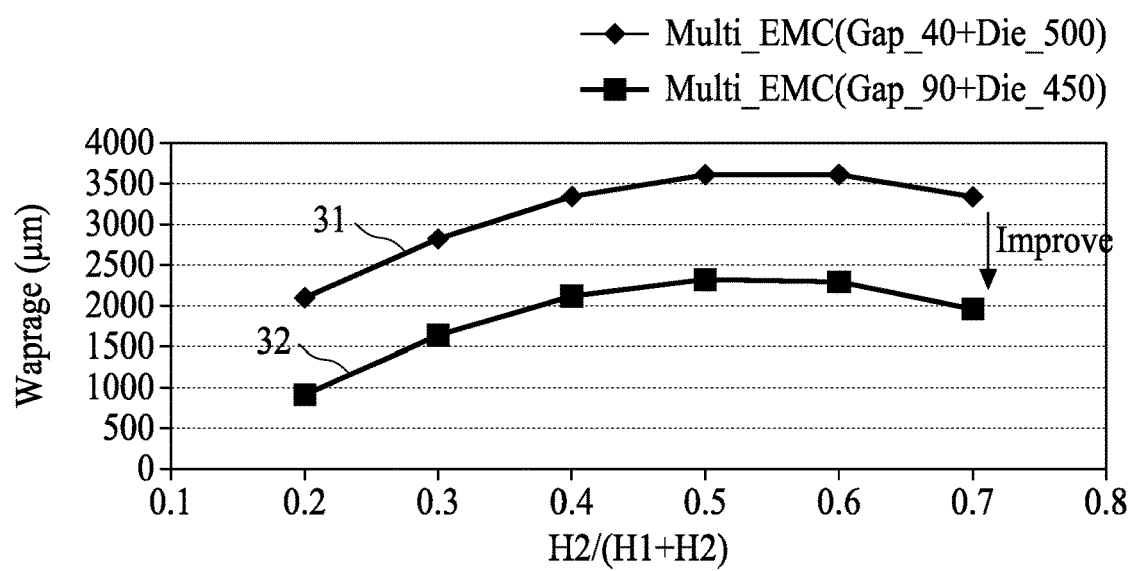
FIG. 3 illustrates an example of a warpage performance plot of a semiconductor device package in accordance with some embodiments of the present disclosure.

FIG. 3 illustrates an example of a warpage performance plot of a semiconductor device package in accordance with some embodiments of the present disclosure. As the example shown in FIG. 3, the warpage performance is measured in $\mu m$ and is plotted on the vertical coordinate, labeled "Warpage ($\mu m$)". The ratio of a thickness H2 of the second encapsulant 14 to the sum of a thickness H1 of the first encapsulant 14 and the thickness H2 of the second encapsulant 15 is plotted on the horizontal coordinate, labeled "H2/(H1+H2)". There are two curves shown in FIG. 3. The curve 31 is marked with diamonds and represents the warpage performance of semiconductor device packages in which a thickness ("Gap") of the second encapsulant 15 above the surface 112 of the semiconductor device 11 is 40 $\mu m$ and the thickness ("Die") of the semiconductor device 11 is 500 $\mu m$. The curve 32 is marked with squares and represents the warpage performance of semiconductor device packages in which the thickness of the second encapsulant 15 above the surface 112 of the semiconductor device 11 is 90 $\mu m$ and the thickness of the semiconductor device 11 is 450 $\mu m$.

As shown in FIG. 2 and FIG. 3, the warpage performance of the semiconductor device package 11 can be controlled by adjusting the CTE of the first encapsulant 14 and the CTE of the second encapsulant 15 or by adjusting the thickness of the first encapsulant 14 and the thickness of the second encapsulant 15. For example, the CTE of the first encapsulant 14 can be substantially equal to the CTE of the second encapsulant 15, or the thickness of the second encapsulant 15 above the surface 112 of the semiconductor device 11 can be at least about 8% of the thickness of the semiconductor device 11, such as at least about 10%, at least about 15%, or at least about 20% of the thickness of the semiconductor device 11. By doing so, a warpage of the semiconductor device package 11 during manufacturing may be controlled.

FIG. 4A, FIG. 4B, FIG. 4C, FIG. 4D, FIG. 4E, FIG. 4F and FIG. 4G illustrate a method of manufacturing a semiconductor device package in accordance with some embodiments of the present disclosure.

Figure 4A:
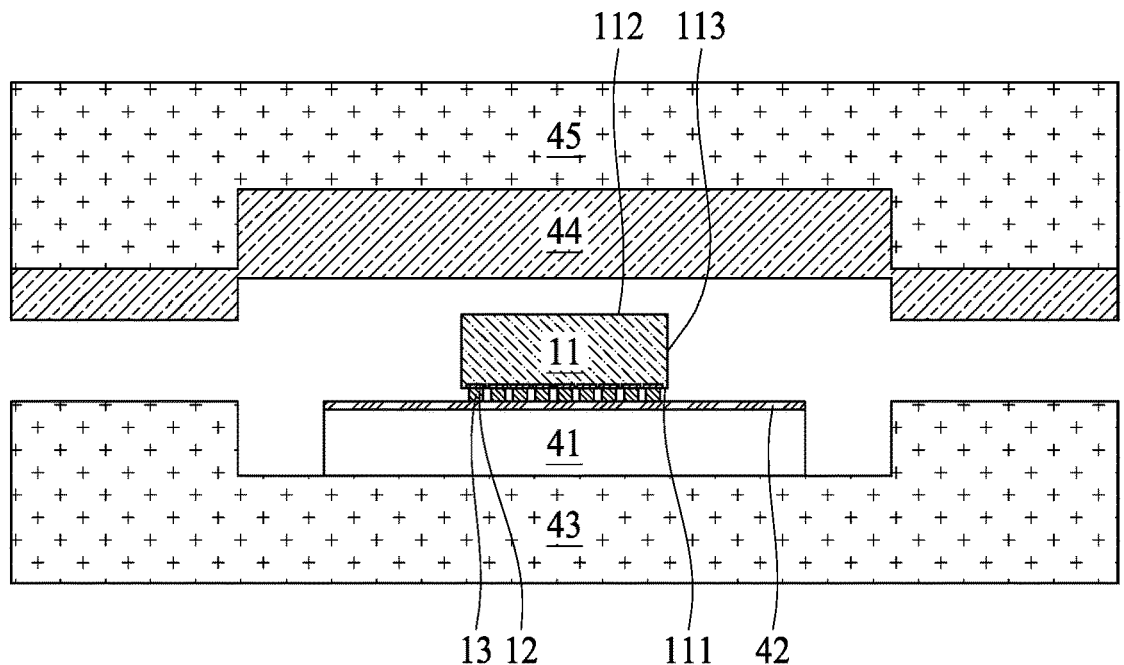
FIG. 4A, FIG. 4B, FIG. 4C, FIG. 4D, FIG. 4E, FIG. 4F and FIG. 4G illustrate a method of manufacturing a semiconductor device package in accordance with some embodiments of the present disclosure.

FIG. 4A illustrates a stage of providing a semiconductor device 11 on a carrier 41. The semiconductor device 11 is placed with an active side face-down on the carrier 41. In some embodiments, a release film 42 is disposed between the first surface 111 of the semiconductor device 11 and the carrier 41. In some embodiments, the release film 42 is an adhesive layer or a tape for fixing the location of the semiconductor device 11. The semiconductor device 11 has a first surface 111 (e.g. at the active side), a surface 112 opposite to the first surface 111 and a lateral surface 113 extending between the first surface 111 and the surface 112, and the semiconductor device 11 further includes a conductive bump 13 adjacent to the first surface 111. The semiconductor device 11 further includes a conductive pad 12 adjacent to the first surface 111 of the semiconductor device 11. In some embodiments, a release film 42 is disposed between the first surface 111 of the semiconductor device 11 and the carrier 41. The carrier 41 is then placed onto a bottom portion 43 of a mold chase. A release film 44 is applied to, or disposed under, a top portion 45 of the mold chase. In some embodiments, the top portion 45 of the mold chase includes one or more vacuum holes so that at least partial vacuum can be created between the top portion 45 of the mold chase and the release film 44 to fix the release film 44 to the top portion 45 of the mold chase.

Figure 4B:
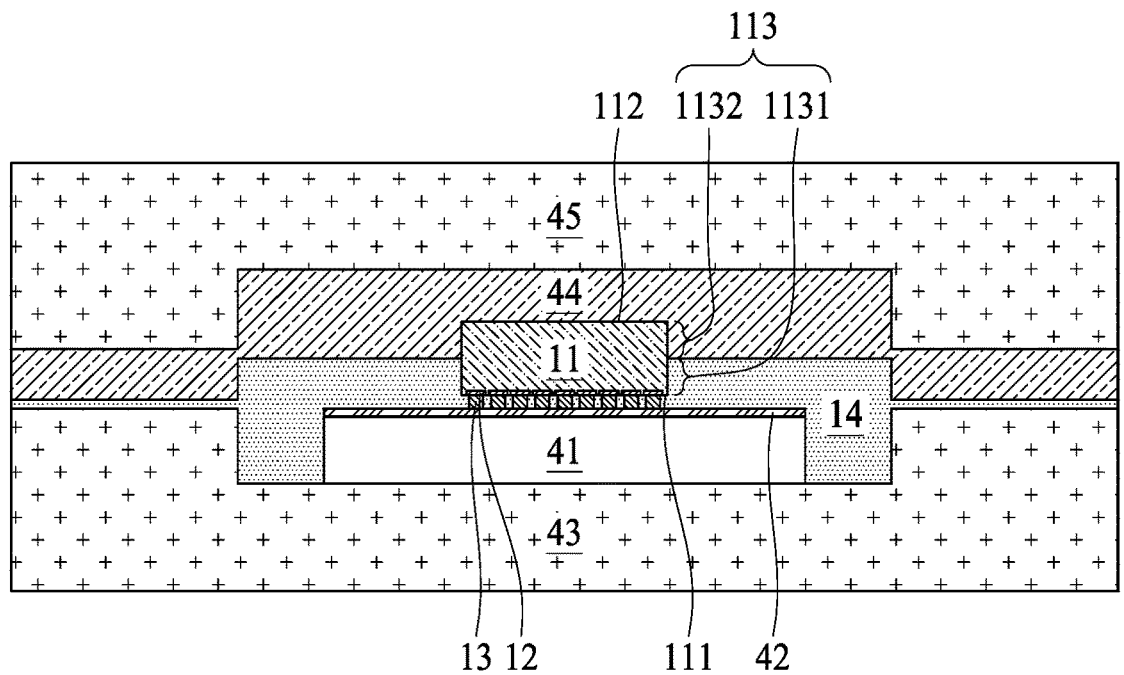

FIG. 4B illustrates a stage of making the release film 44 contact with the surface 112 of the semiconductor device 11. In some embodiments, the surface 112 of the semiconductor device 11 is partially compressed into the release film 44 by engaging the bottom portion 43 of the mold chase and the top portion 45 of the mold chase. FIG. 4B also illustrates forming a first encapsulant 14 covering the first surface 111 of the semiconductor device 11 and a portion 1131 of the lateral surface 113 of the semiconductor device 11. In some embodiments, the first encapsulant 14 surrounds the conductive bump 13. Since the semiconductor device 11 is partially compressed into the release film 44, the semiconductor device 11 may not suffer from die-shifting when liquid molding compound flows into the space between the bottom portion 43 of the mold chase and the top portion 45 of the mold chase. In some embodiments, the intermediate product shown in FIG. 4B may be put through a first post molded curing process for curing the first encapsulant 14.

Figure 4C:
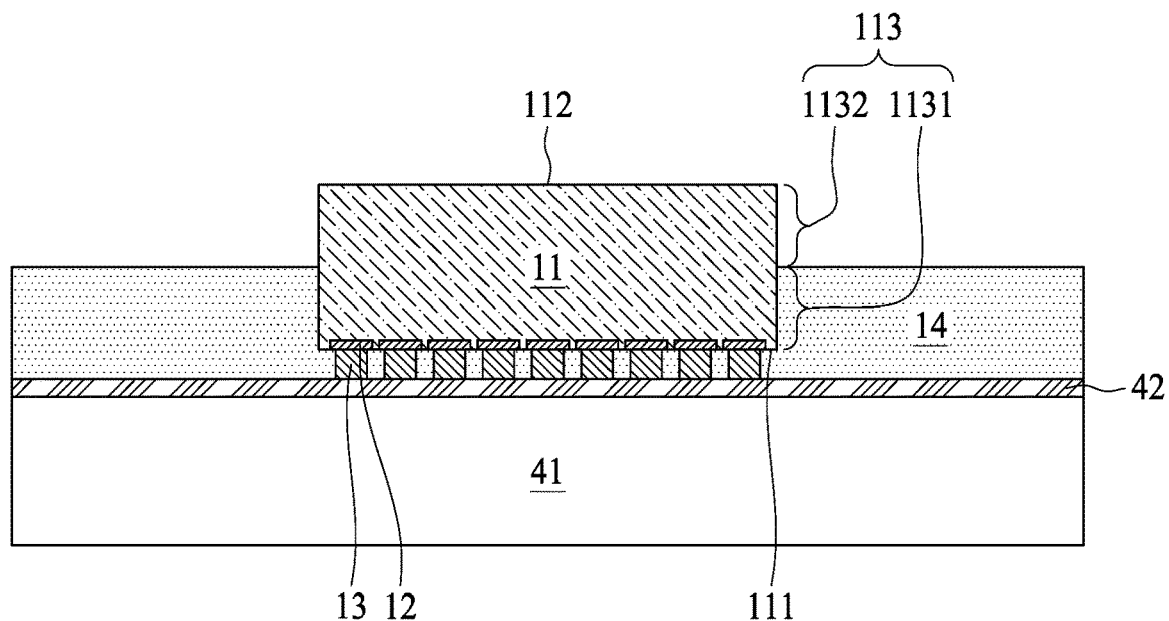
Figure 4D:
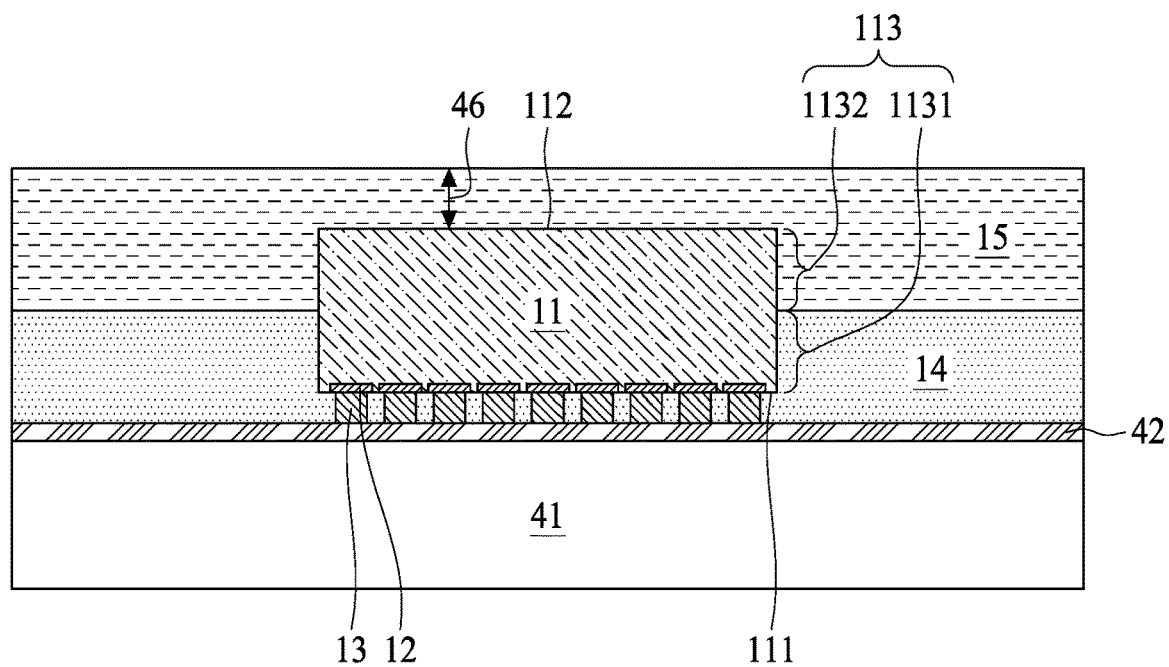

FIG. 4C illustrates a stage of removing the release film 44 from the semiconductor device 11. FIG. 4D illustrates forming a second encapsulant 15 covering the surface 112 of the semiconductor device 11 and a portion 1132 of the lateral surface 113 of the semiconductor device 11. In some embodiments, the first encapsulant 14 is formed prior to forming the second encapsulant 15. In some embodiments, a width of a gap 46 between the top portion 45 of the mold chase and the surface 112 of the semiconductor device 11 is kept substantially constant (e.g. does not vary by more than 1% of a starting width, 2% of a starting width, 3% of a starting width, 4% of a starting width, 5% of a starting width, or 10% of a starting width) after forming the first encapsulant 14 until the second encapsulant 15 is formed, and the second encapsulant 15 is formed while the gap 46 is kept substantially constant. In some embodiments, the second encapsulant 15 is formed in the gap 46, and a thickness of the second encapsulant 15 on the semiconductor device 11 corresponds to a width of the gap 46. In some embodiments, the second encapsulant 15 is formed by moving the carrier 41 to another mold chase, or by one or more processes that include adjusting the distance between the top portion 43 of the mold chase and the bottom portion 45 of the mold chase. In some embodiments, the intermediate product shown in FIG. 4D may be put through a second post molded curing process for curing the second encapsulant 15.

Figure 4E:
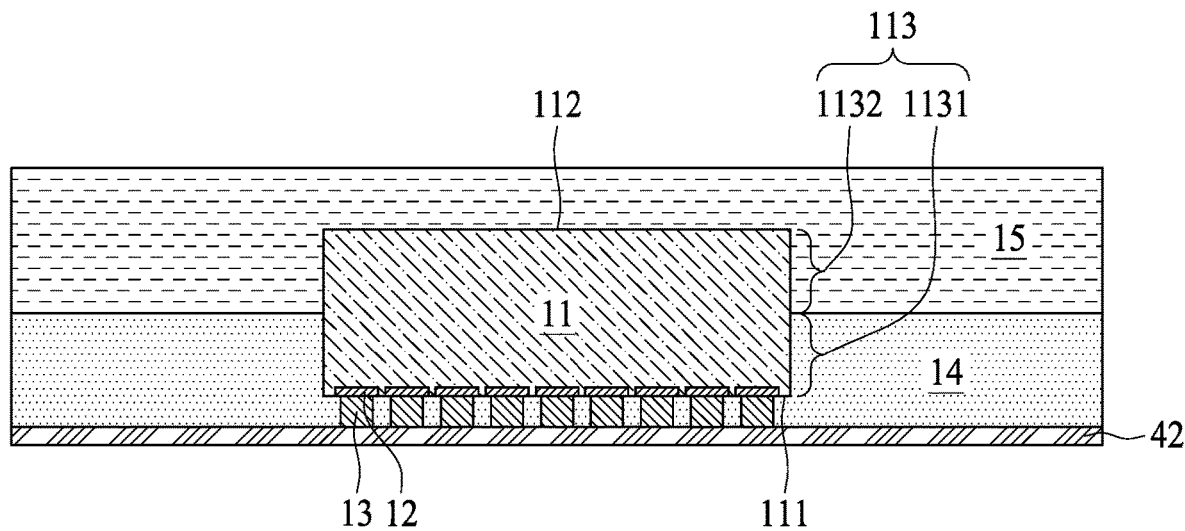
Figure 4F:
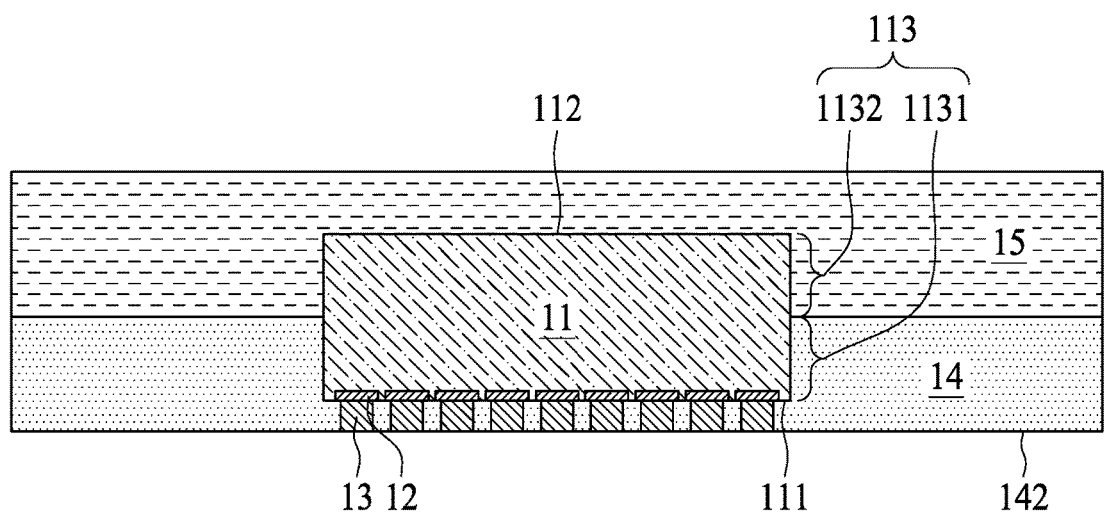
Figure 4G:
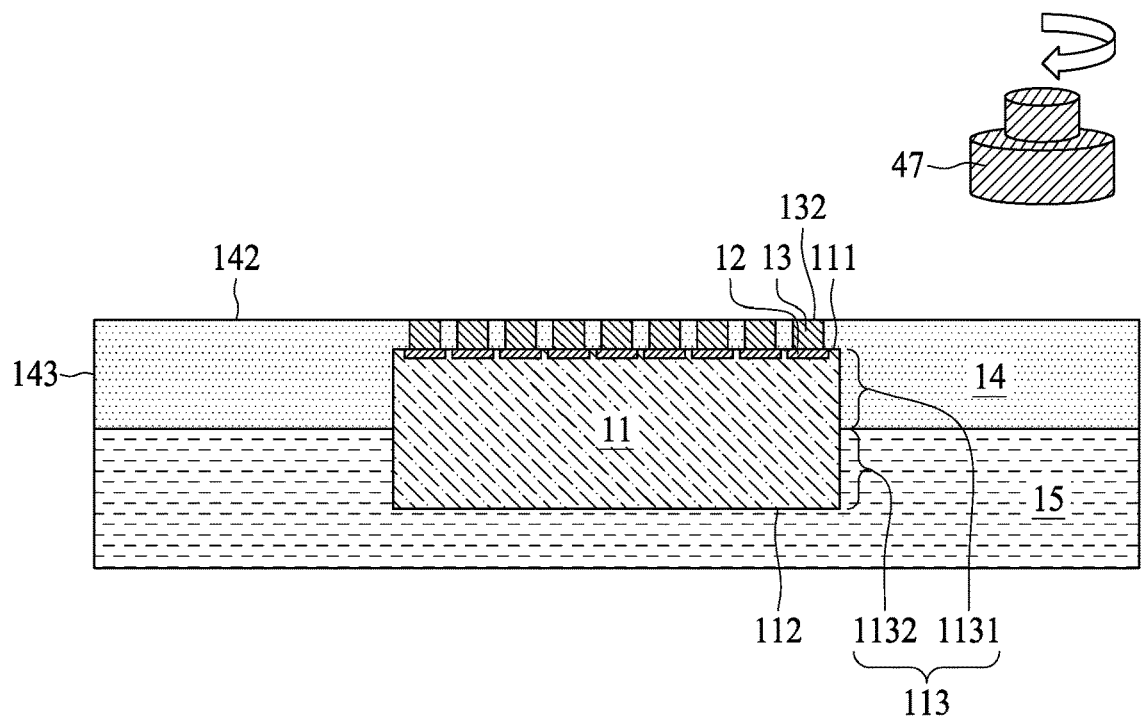

FIG. 4E illustrates a stage of removing the carrier 41 from the release film 42. FIG. 4F illustrates a stage of removing the release film 42 from a surface 142 of the first encapsulant 14 (e.g. a bottom surface of the first encapsulant 14). In some embodiments, the semiconductor device package is then singulated and/or is printed with a fiducial mark. As shown in FIG. 4G, the surface 142 of the first encapsulant 14 and a surface 132 of the conductive bump 13 are grinded by a grinder 47 or a polisher 47. Through grinding, a roughness of the surface 142 of the first encapsulant 14 is less than a roughness of a lateral surface 143 of the first encapsulant 14, and a contact angle of the surface 142 of the first encapsulant 14 is greater than a contact angle of the lateral surface 143 of the first encapsulant 14. Finally, the semiconductor device package shown in FIG. 1A is formed. Since the surface 142 of the first encapsulant 14 is grinded together with the surface 132 of the conductive bump 13, the improved flatness (e.g. the lesser roughness) of both the surface 142 of the first encapsulant 14 and the surface 132 of the conductive bump 13 can increase the reliability of subsequent processes, such as forming other RDLs.

FIG. 5A, FIG. 5B, FIG. 5C, FIG. 5D, FIG. 5E and FIG. 5F illustrate a method of manufacturing semiconductor device packages in accordance with some embodiments of the present disclosure.

Figure 5A:
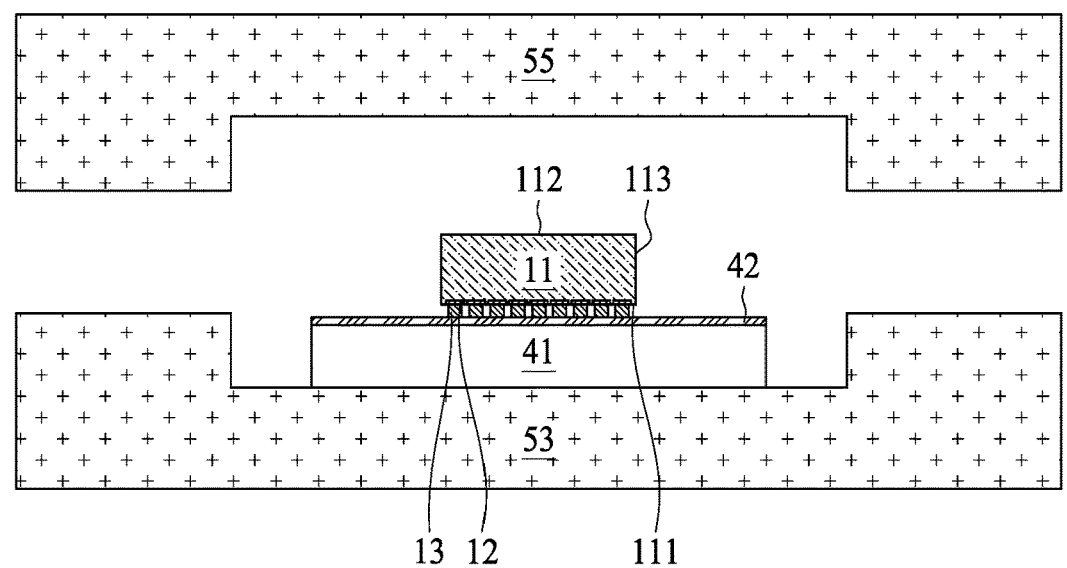
FIG. 5A, FIG. 5B, FIG. 5C, FIG. 5D, FIG. 5E and FIG. 5F illustrate a method of manufacturing a semiconductor device package in accordance with some embodiments of the present disclosure.

FIG. 5A illustrates a stage of providing a semiconductor device 11 on a carrier 41. The semiconductor device 11 is placed with an active side face-down on the carrier 41. In some embodiments, a release film 42 is disposed between the first surface 111 of the semiconductor device 11 and the carrier 41. In some embodiments, the release film 42 is an adhesive layer or a tape for fixing the location of the semiconductor device 11. The semiconductor device 11 has a first surface 111 (e.g. at the active side), a surface 112 opposite to the first surface 111 and a lateral surface 113 extending between the first surface 111 and the surface 112, wherein the semiconductor device 11 further includes a conductive bump 13 adjacent to the first surface 111. The semiconductor device 11 further includes a conductive pad 12 adjacent to the first surface 111 of the semiconductor device 11. The carrier 41 is then placed onto a bottom portion 53 of a mold chase. A top portion 55 of the mold chase may be disposed above the bottom portion 53 of the mold chase.

Figure 5B:
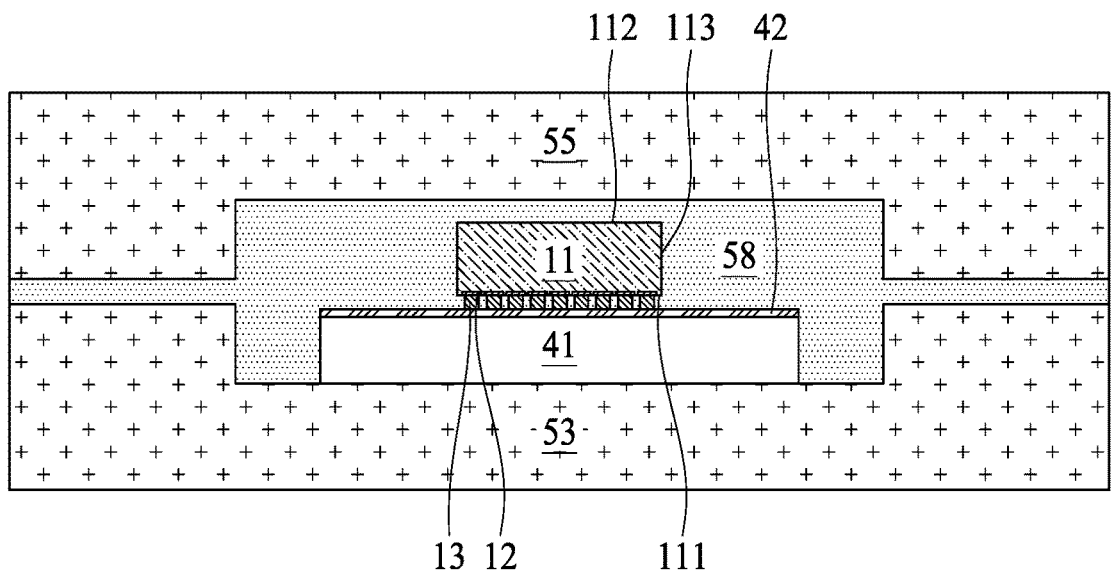

FIG. 5B illustrates a stage of engaging the bottom portion 53 of the mold chase and the top portion 55 of the mold chase. FIG. 5B also illustrates forming an encapsulant 58 covering the first surface 111, the surface 112 and the lateral surface 113 of the semiconductor device 11. In some embodiments, the encapsulant 58 surrounds the conductive bump 13.

Figure 5C:
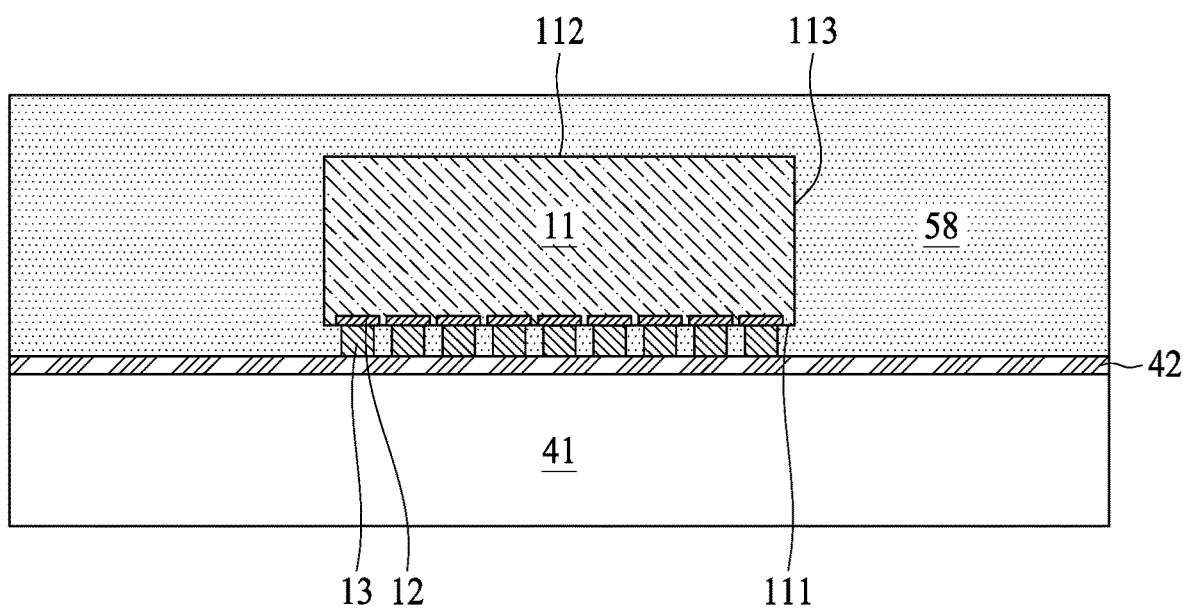
Figure 5D:
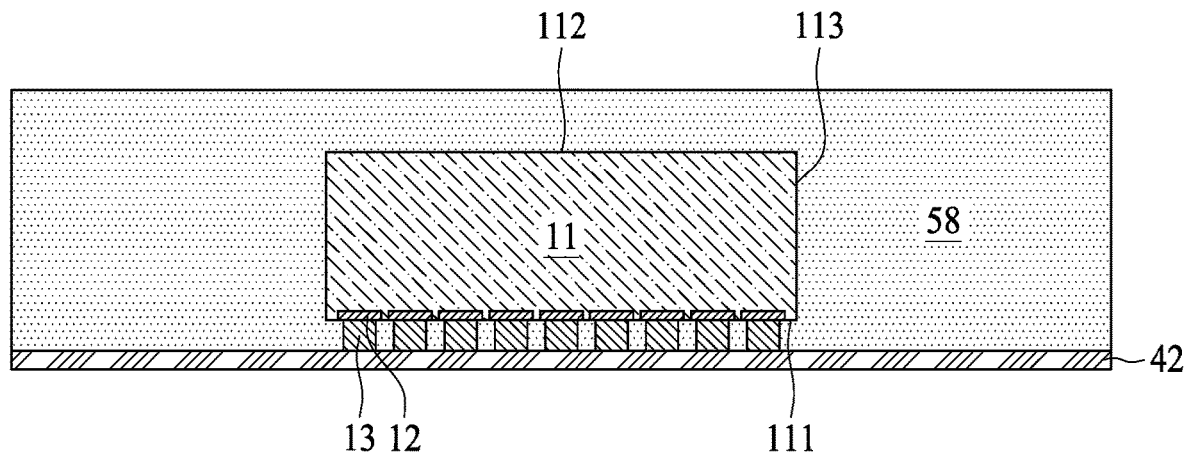
Figure 5E:
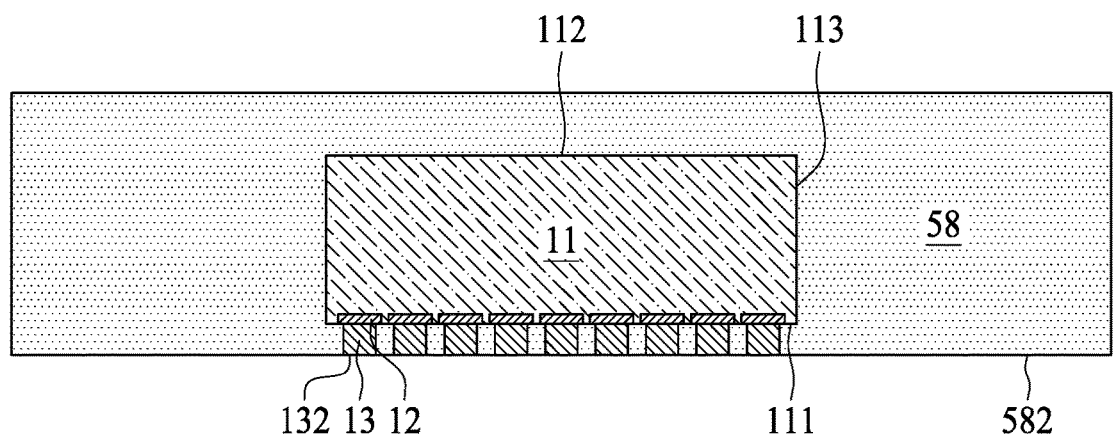
Figure 5F:
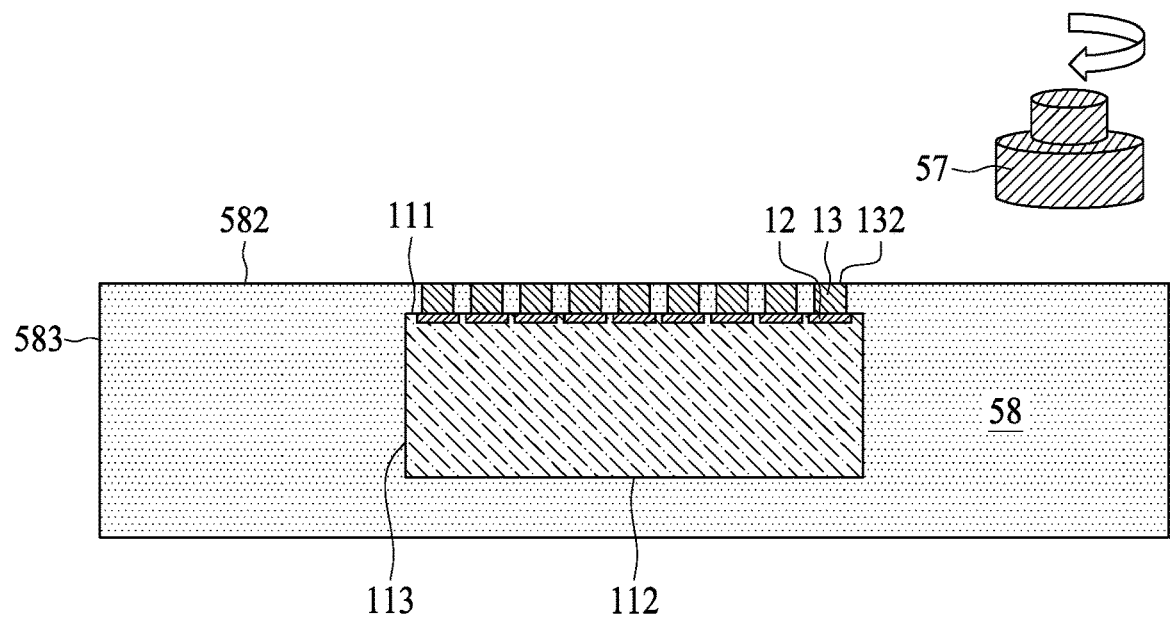

FIG. 5C illustrates a stage of removing the mold chase from the carrier 41 and the encapsulant 58. FIG. 5D illustrates a stage of removing the carrier 41 from the release film 42. FIG. 5E illustrates a stage of removing the release film 42 from a surface 582 of the encapsulant 58. In some embodiments, the semiconductor device package is then singulated and/or is printed with a fiducial mark. As shown in FIG. 5F, a surface 582 (e.g. a bottom surface) of the encapsulant 58 and a surface 132 of the conductive bump 13 are grinded by a grinder 57 or a polisher 57. Through grinding, a roughness of the surface 582 of the encapsulant 58 is less than a roughness of a lateral surface 583 of the encapsulant 58, and a contact angle of the surface 582 of the encapsulant 58 is greater than a contact angle of the lateral surface 583 of the encapsulant 58.

FIG. 6A, FIG. 6B, FIG. 6C, FIG. 6D, FIG. 6E, FIG. 6F and FIG. 6G illustrate a method of manufacturing semiconductor device packages in accordance with some embodiments of the present disclosure.

Figure 6A:
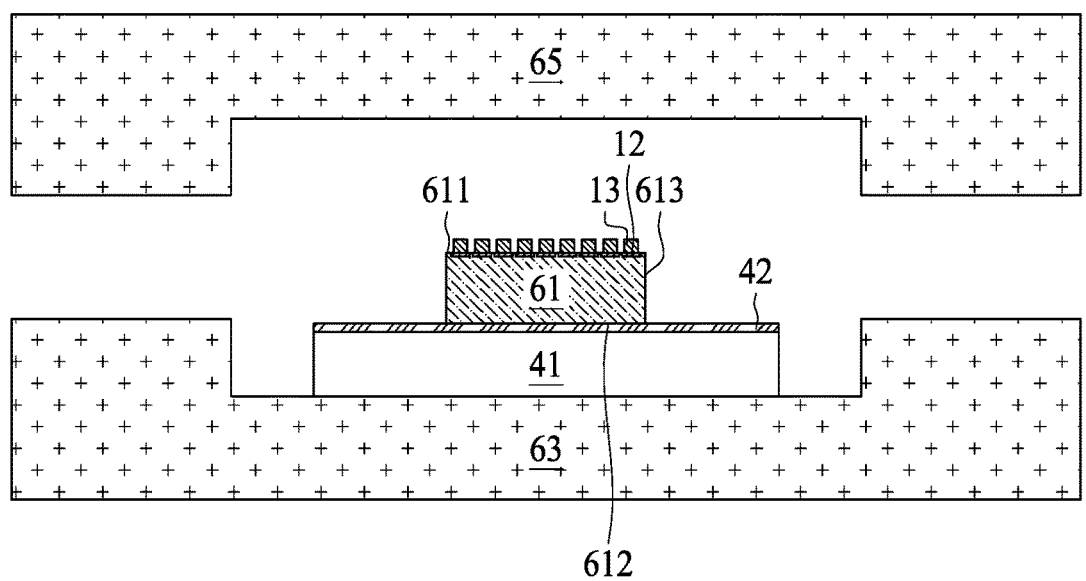
FIG. 6A, FIG. 6B, FIG. 6C, FIG. 6D, FIG. 6E, FIG. 6F and FIG. 6G illustrate a method of manufacturing a semiconductor device package in accordance with some embodiments of the present disclosure.

FIG. 6A illustrates a stage of providing a semiconductor device 61 on a carrier 41. The semiconductor device 61 is placed with an active side face-up on the carrier 41. The semiconductor device 61 has a first surface 611 (e.g. at the active side), a second surface 612 opposite to the first surface 611 and a lateral surface 613 extending between the first surface 611 and the second surface 612, wherein the semiconductor device 61 further includes a conductive bump 13 adjacent to the surface first 611. In some embodiments, the second surface 612 of the semiconductor device 61 is in contact with the carrier 41. In some embodiments, a release film 42 is disposed between the second surface 612 of the semiconductor device 61 and the carrier 41. In some embodiments, the release film 42 is an adhesive layer or a tape for fixing the location of the semiconductor device 61. The semiconductor device 61 further includes a conductive pad 12 adjacent to the first surface 611 of the semiconductor device 61. The carrier 41 is then placed onto a bottom portion 63 of a mold chase. A top portion 65 of the mold chase may be disposed above the bottom portion 63 of the mold chase.

Figure 6B:
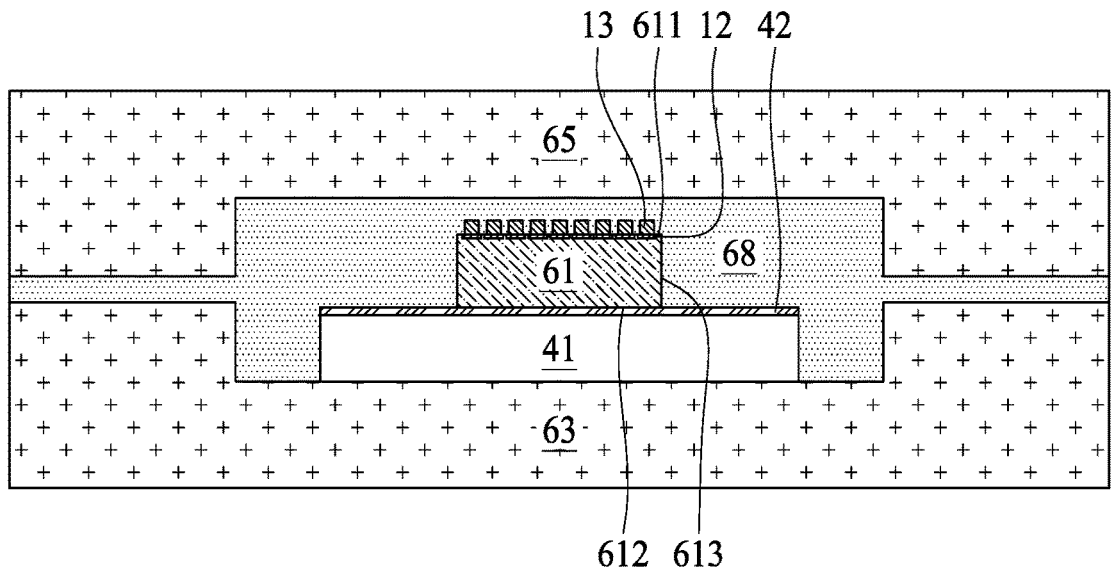

FIG. 6B illustrates a stage of engaging the bottom portion 63 of the mold chase and the top portion 65 of the mold chase. FIG. 6B also illustrates forming an encapsulant 68 covering the second surface 612 and the lateral surface 613 of the semiconductor device 61. In some embodiments, the encapsulant 68 surrounds the conductive bump 13.

Figure 6C:
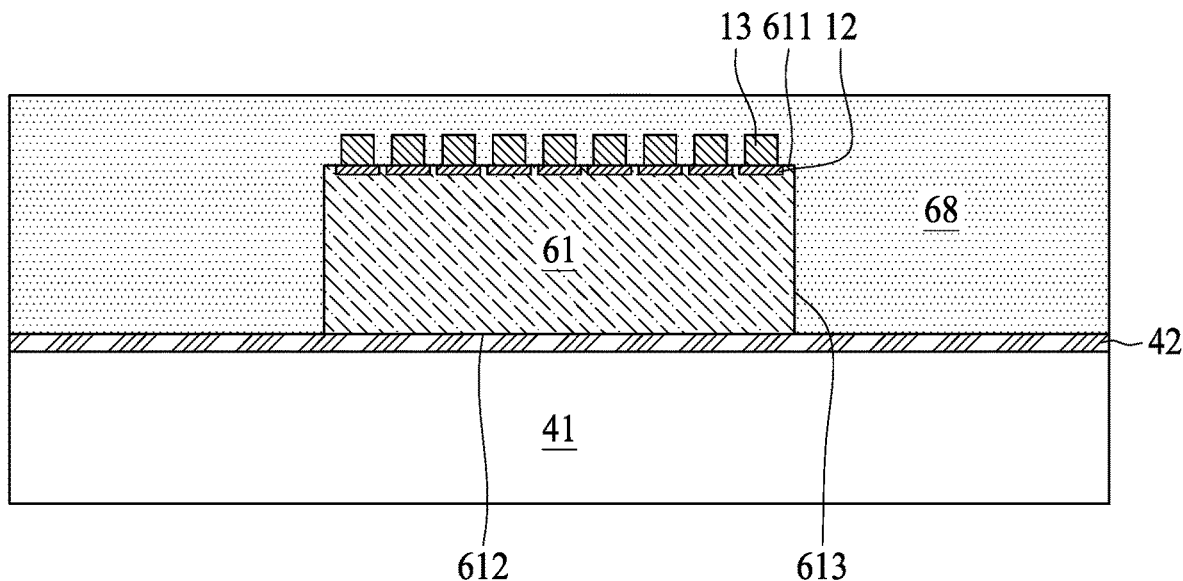
Figure 6D:
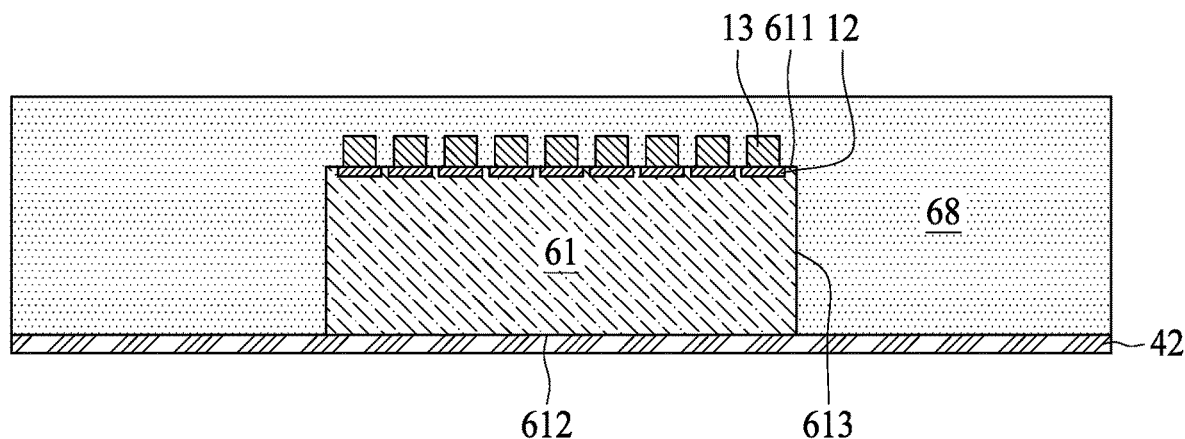
Figure 6E:
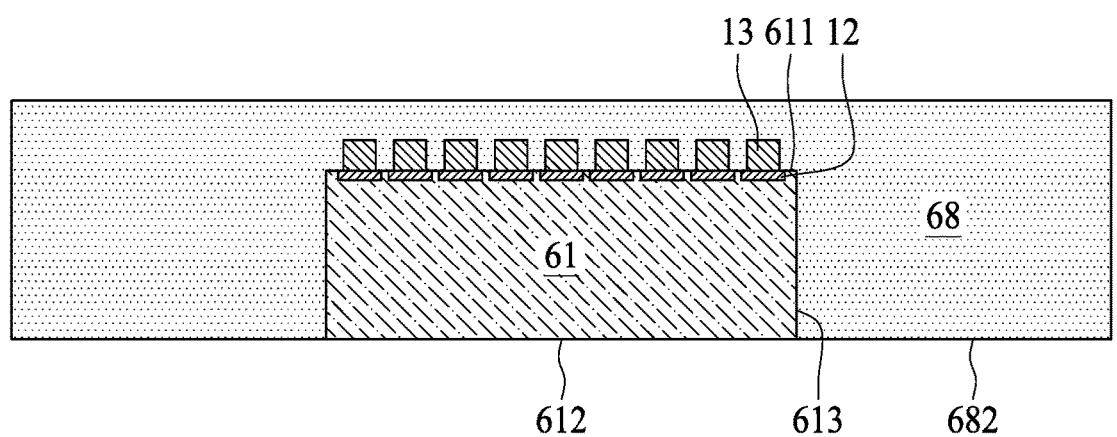
Figure 6F:
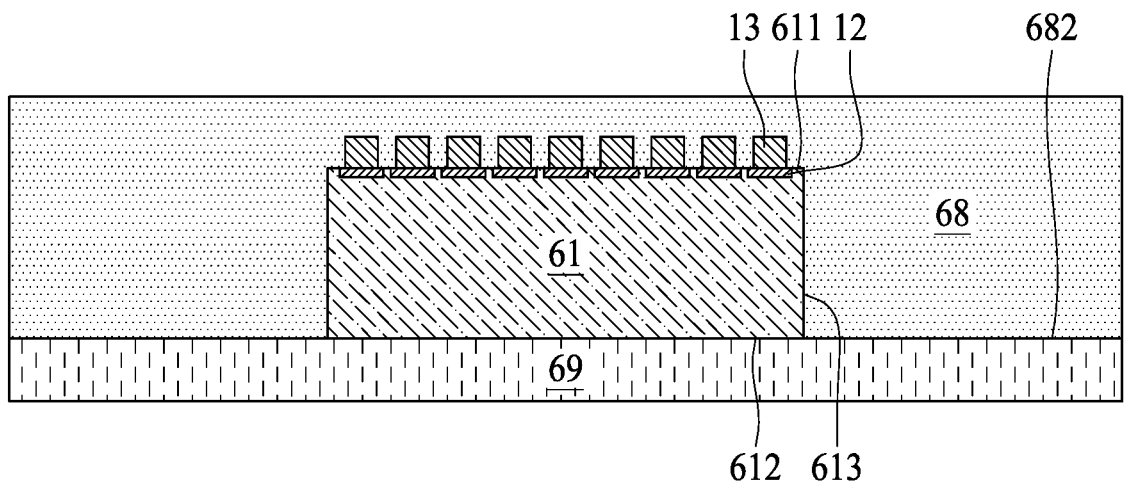
Figure 6G:
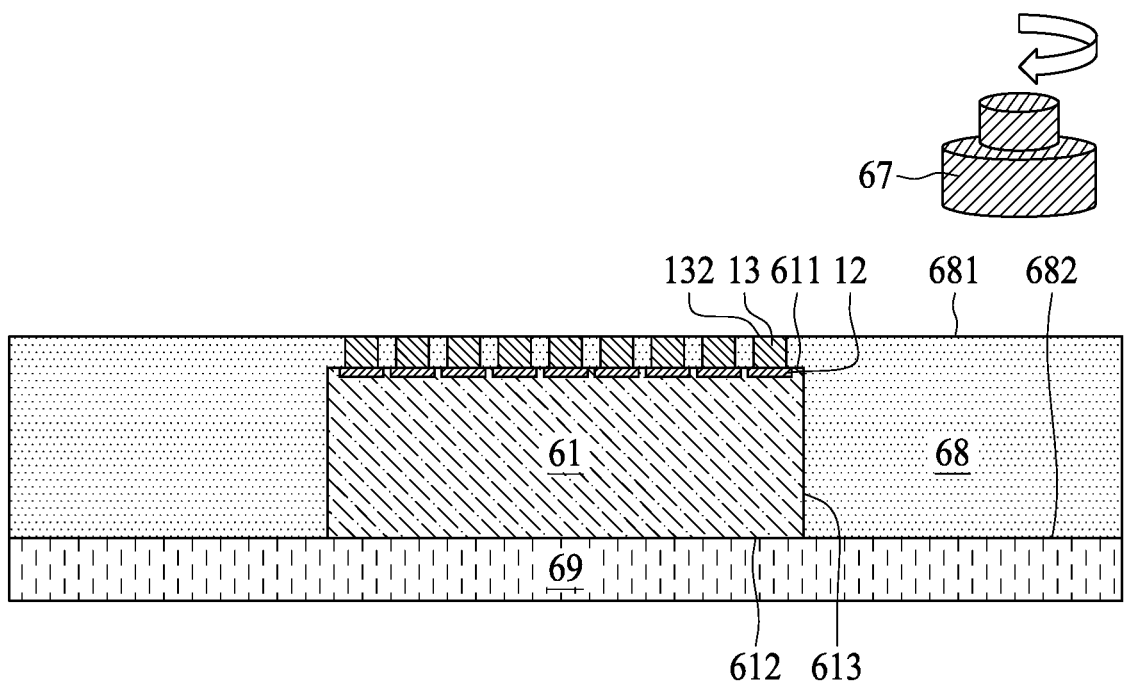

FIG. 6C illustrates a stage of removing the mold chase from the carrier 41 and the encapsulant 68. FIG. 6D illustrates a stage of removing the carrier 41 from the release film 42. FIG. 6E illustrates a stage of removing the release film 42 from a surface 682 (e.g. a bottom surface) of the encapsulant 68. In some embodiments, the semiconductor device package is then singulated and/or is printed with a fiducial mark. As shown in FIG. 6F, a BSP layer 69 is applied in contact with the surface 682 of the encapsulant 68 for protecting the semiconductor device 61. As shown in FIG. 6G, the encapsulant 68 is grinded by a grinder 67 or a polisher 67 so that a surface 132 of the conductive bump 13 is exposed from the encapsulant 68. In some embodiments, the surface 681 of the encapsulant 68 of and the surface 132 of the conductive bump 13 are substantially coplanar.

As used herein, the singular terms "a," "an," and "the" may include plural referents unless the context clearly dictates otherwise.

As used herein, the terms "connect," "connected," and "connection" refer to an operational coupling or linking. Connected components can be directly or indirectly coupled to one another, for example, through another set of components.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the terms "approximately," "substantially" "substantial," and "about" refer to a considerable degree or extent. When used in conjunction with an event or situation, the terms can refer to instances in which the event or situation occurs precisely as well as instances in which the event or situation occurs to a close approximation, such as when accounting for typical tolerance levels of the manufacturing methods described herein. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 μm, within 30 μm, within 20 μm, within 10 μm, within 1 μm, or within 0.5 μm of lying along the same plane.

Additionally, amounts, ratios, and other numerical values are sometimes presented herein in a range format. It is understood that such range formats are used for convenience and brevity, and should be interpreted flexibly to include numerical values explicitly specified as limits of a range, as well as all individual numerical values or sub-ranges encompassed within that range, as if each numerical value and sub-range is explicitly specified.

In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims.

The construction and arrangement of the structures and methods as shown in the various example embodiments are illustrative only. Accordingly, all such modifications are intended to be included within the scope of the present disclosure. The order or sequence of any process or method steps may be varied or re-sequenced according to alternative embodiments. Other substitutions, modifications, changes, and omissions may be made in the design, operating conditions and arrangement of the example embodiments without departing from the scope of the present disclosure.

What is claimed is:

1. A semiconductor device package, comprising:
a semiconductor device having a first surface, a second surface opposite to the first surface and a lateral surface extending between the first surface and the second surface;
a first encapsulant encapsulating the first surface of the semiconductor device and a first portion of the lateral surface of the semiconductor device;
a second encapsulant encapsulating the second surface of the semiconductor device and a second portion of the lateral surface of the semiconductor device; and
a conductive bump contacting to the first surface of the semiconductor device, wherein the first encapsulant surrounds the conductive bump, wherein the conductive bump is exposed at a first surface of the first encapsulant;
wherein a boundary between the first encapsulant and the second encapsulant has a curved surface near the semiconductor device and has a flat surface away from the semiconductor device, wherein the curved surface bends toward the second encapsulant.

2. The semiconductor device package of claim 1, wherein the first encapsulant has a concave surface and the second encapsulant has a convex surface near the semiconductor device, wherein the concave surface and the convex surface define a portion of the boundary between the first encapsulant and the second encapsulant, and the first encapsulant and the second encapsulant have a flat surface away from the semiconductor device that defines other portions of the boundary.

3. The semiconductor device package of claim 1, wherein a lateral surface of the first encapsulant is in contact with the lateral surface of the semiconductor device, wherein a lateral surface of the second encapsulant is in contact with the lateral surface of the semiconductor device, and wherein the lateral surface of the first encapsulant is coplanar with the lateral surface of the second encapsulant.

4. The semiconductor device package of claim 1, wherein the coefficient of thermal expansion of the first encapsulant is smaller than the coefficient of thermal expansion of the second encapsulant.

5. The semiconductor device package of claim 4, wherein a thickness of the second encapsulant is smaller than 30% or larger than 60% of a total thickness of the first encapsulant and the second encapsulant.

6. The semiconductor device package of claim 1, wherein the coefficient of thermal expansion of the first encapsulant is larger than the coefficient of thermal expansion of the second encapsulant.

7. The semiconductor device package of claim 6, wherein a thickness of the second encapsulant is smaller than 30% or larger than 60% of a total thickness of the first encapsulant and the second encapsulant.

8. The semiconductor device package of claim 1, wherein the second encapsulant includes a portion disposed on the second surface of the semiconductor device, and a thickness of the portion of the second encapsulant is at least 8% of a thickness of the semiconductor device.

9. The semiconductor device package of claim 8, wherein a thickness of the second encapsulant is smaller than 30% or larger than 60% of a total thickness of the first encapsulant and the second encapsulant.

10. The semiconductor device package of claim 1, wherein the first encapsulant and the second encapsulant have different coefficients of thermal expansion.

11. The semiconductor device package of claim 1, wherein a roughness of the first surface of the first encapsulant is less than a roughness of a lateral surface of the first encapsulant.

* * * * *